(12) United States Patent
Broekaart et al.

(10) Patent No.: US 10,297,464 B2
(45) Date of Patent: May 21, 2019

(54) PROCESS FOR THE MANUFACTURE OF A SEMICONDUCTOR ELEMENT COMPRISING A LAYER FOR TRAPPING CHARGES

(71) Applicant: Soitec, Bernin (FR)

(72) Inventors: Marcel Broekaart, Theys (FR); Luciana Capello, Grenoble (FR); Isabelle Bertrand, Bernin (FR); Norbert Colombet, Domene (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 15/577,133

(22) PCT Filed: Jun. 1, 2016

(86) PCT No.: PCT/EP2016/062334
§ 371 (c)(1),
(2) Date: Nov. 27, 2017

(87) PCT Pub. No.: WO2016/198298
PCT Pub. Date: Dec. 15, 2016

(65) Prior Publication Data
US 2018/0182640 A1    Jun. 28, 2018

(30) Foreign Application Priority Data
Jun. 9, 2015   (FR) .................................. 15 55248

(51) Int. Cl.
*H01L 21/324*    (2006.01)
*H01L 21/322*    (2006.01)
(Continued)

(52) U.S. Cl.
CPC ........ *H01L 21/324* (2013.01); *H01L 21/3226* (2013.01); *H01L 21/76251* (2013.01);
(Continued)

(58) Field of Classification Search
CPC ... H01L 29/04; H01L 29/045; H01L 21/3226; H01L 21/324; H01L 21/84; H01L 21/67115; H01L 21/2686
See application file for complete search history.

(56) References Cited

U.S. PATENT DOCUMENTS

| 4,868,133 A | 9/1989 | Huber |
| 6,544,656 B1 | 4/2003 | Abe et al. |

(Continued)

FOREIGN PATENT DOCUMENTS

| FR | 2860341 | 4/2005 |
| FR | 2933233 | 1/2010 |

(Continued)

OTHER PUBLICATIONS

International Search Report for International Application No. PCT/EP2016/062334 dated Aug. 19, 2016, 3 pages.

(Continued)

Primary Examiner — Thanh Y Tran
(74) Attorney, Agent, or Firm — TraskBritt

(57) ABSTRACT

A process for the manufacture of a semiconductor element includes a stage of rapid heat treatment of a substrate comprising a charge-trapping layer, which is capable of damaging an RF characteristic of the substrate. The rapid heat treatment stage is followed by a healing heat treatment of the substrate between 700° C. and 1,100° C., for a period of time of at least 15 seconds.

14 Claims, 2 Drawing Sheets

(51) Int. Cl.
*H01L 21/84* (2006.01)
*H01L 21/66* (2006.01)
*H01L 29/10* (2006.01)
*H01L 21/762* (2006.01)
*H01L 21/268* (2006.01)
*H01L 21/67* (2006.01)

(52) U.S. Cl.
CPC .............. *H01L 21/84* (2013.01); *H01L 22/14* (2013.01); *H01L 29/1079* (2013.01); *H01L 21/2686* (2013.01); *H01L 21/67115* (2013.01); *H01L 21/76254* (2013.01)

(56) References Cited

U.S. PATENT DOCUMENTS

| | | | |
|---|---|---|---|
| 7,268,060 | B2 | 9/2007 | Ghyselen et al. |
| 2006/0166451 | A1 | 7/2006 | Raskin et al. |
| 2008/0122043 | A1* | 5/2008 | Blietz ................ H01L 21/2007 257/629 |
| 2008/0283837 | A1* | 11/2008 | Tanada .................. H01L 27/12 257/59 |
| 2009/0042375 | A1 | 2/2009 | Sawada et al. |
| 2009/0170248 | A1 | 7/2009 | Kim et al. |
| 2009/0321873 | A1 | 12/2009 | Nguyen et al. |
| 2011/0049594 | A1 | 3/2011 | Dyer et al. |
| 2011/0114623 | A1 | 5/2011 | Goodman et al. |
| 2012/0012847 | A1* | 1/2012 | Koyama ............. G02F 1/13454 257/59 |
| 2012/0319121 | A1 | 12/2012 | Reynaud et al. |
| 2014/0340137 | A1 | 11/2014 | Keane et al. |
| 2015/0037967 | A1 | 2/2015 | Wilshaw et al. |
| 2015/0115480 | A1 | 4/2015 | Peidous et al. |
| 2016/0276209 | A1 | 9/2016 | Usenko |
| 2017/0331501 | A1 | 11/2017 | Kononchuk et al. |
| 2018/0033681 | A1* | 2/2018 | Ishikawa ........... H01L 21/76254 |
| 2018/0130698 | A1 | 5/2018 | Kononchuk |

FOREIGN PATENT DOCUMENTS

| | | |
|---|---|---|
| FR | 2953640 A1 | 6/2011 |
| FR | 3029682 A1 | 6/2016 |
| FR | 3037438 A1 | 12/2016 |
| WO | 2016/198298 A1 | 12/2016 |

OTHER PUBLICATIONS

International Written Opinion for International Application No. PCT/EP2016/062334 dated Aug. 19, 2016, 4 pages.

Lederer et al., RF Performance of a Commerical SOI Technology, Transferred Onto a Passivated HR Silicon Substrate, IEEE Transaction on Electron Devices, vol. 55, No. 7, Jul. 2008, pp. 1664-1671.

* cited by examiner

PROCESS FOR THE MANUFACTURE OF A SEMICONDUCTOR ELEMENT COMPRISING A LAYER FOR TRAPPING CHARGES

CROSS-REFERENCE TO RELATED APPLICATIONS

This application is a national phase entry under 35 U.S.C. § 371 of International Patent Application PCT/EP2016/062334, filed Jun. 1, 2016, designating the United States of America and published as International Patent Publication WO 2016/198298 A1 on Dec. 15, 2016, which claims the benefit under Article 8 of the Patent Cooperation Treaty to French Patent Application Serial No. 1555248, filed Jun. 9, 2015.

TECHNICAL FIELD

The invention relates to a process for manufacturing a semiconductor element comprising a layer for trapping charges.

BACKGROUND

Integrated devices are normally prepared on substrates in the form of wafers, which act mainly as support in their manufacture. However, the increase in the degree of integration and in the performances expected for these devices is leading to an increasingly significant coupling between their performances and the characteristics of the substrate on which they are formed. This is particularly the case with radio frequency (RF) devices, which process signals for which the frequency is between approximately 3 kHz and 300 GHz, which in particular have application in the field of telecommunications (telephony, Wi-Fi, BLUETOOTH®, and the like).

As example of the device/substrate coupling, electromagnetic fields, which result from the high frequency signals propagating in the devices, penetrate into the depth of the substrate and interact with the possible charge carriers that are found therein. This results in an unnecessary consumption of a portion of the energy of the signal by insertion loss and possible influences between components by crosstalk.

Radio frequency devices, such as switches and aerial tuners, and also power amplifiers, can be prepared on substrates specifically adapted in order to take into account these phenomena and in order to improve the performances thereof.

Thus, silicon-on-insulator (SOI) substrates are known that comprise, as is represented in FIG. 1, a support substrate 2, a charge-trapping layer 3 positioned on the support substrate 2, an insulating layer 4 positioned on the charge-trapping layer 3, and a surface silicon layer 5 positioned on the insulating layer. The support substrate 2 can exhibit a resistivity of greater than 1 kohm·cm. The charge-trapping layer 3 can comprise nondoped polycrystalline silicon. The charge-trapping layer 3 makes it possible to reduce the abovementioned device/substrate coupling and thus to ensure good performances for the RF devices. The manufacture of this type of substrate is described, for example, in the documents FR 2 860 341, FR 2 933 233, FR 2 953 640 and US 2015/115480.

The Applicant Company has observed that the application of a rapid heat treatment applied to such an SOI substrate could result in the radiofrequency properties of this substrate being affected. These rapid heat treatments are of particular use in treating the surface of a substrate during its manufacture. This is also a necessary stage in the normal processes for the manufacture of CMOS components, for example for the activation of the dopants.

More specifically, the Applicant Company has observed that the "second harmonic distortion" characterization measurement proves to be of the order of 25% lower in the case of a substrate, which has been subjected to a rapid heat treatment, than in the case of a substrate that has not been subjected to a rapid heat treatment.

This characterization measurement, a detailed description of which will be found in the document entitled "White paper—RF SOI Characterisation" and published by Soitec in January, 2015, is particularly relevant as it is very representative of the expected performance of an RF device formed on the substrate characterized.

However, the level achieved by this measurement on the SOI substrates exhibiting a charge-trapping layer and which have been subjected to a rapid heat treatment is not sufficiently high to guarantee the operation of the RF device under the specifications required.

BRIEF SUMMARY

One aim of the present disclosure is to provide a process for the manufacture of a semiconductor element comprising a rapid heat treatment stage which does not exhibit the losses in performances found.

For the purpose of the achieving of this aim, the disclosure provides a process for the manufacture of a semiconductor element, the process comprising a stage of rapid heat treatment of a substrate comprising a charge-trapping layer which is capable of damaging an RF characteristic of this substrate.

This process is noteworthy in that the rapid heat treatment stage is followed by a healing heat treatment of the substrate between 700° C. and 1100° C. for a period of time of at least 15 seconds.

Surprisingly, the Applicant Company has demonstrated that, following this healing heat treatment, the substrate exhibits the expected radiofrequency characteristic, that is to say at the same level as a substrate which was not treated by a rapid heat treatment.

The healing heat treatment is simple to carry out; it can be a heat treatment at 950° C. over one hour in a neutral or reducing atmosphere carried out in a conventional vertical oven.

Advantageously, the radiofrequency characteristic of the substrate is evaluated by a second harmonic distortion measurement. As was indicated above, this measurement is very representative of the RF performance of a component that will be formed on this substrate.

Preferably, the rapid heat treatment is carried out in a rapid heat treatment device, such as a rapid thermal annealing (RTA) device or in a flash annealing device, which are commonly used in the fields of the manufacture of semiconductor components and substrates.

Advantageously, the rapid heat treatment comprises the exposure of the substrate to a treatment atmosphere for a maximum period of time of two minutes at a plateau temperature of between 1,125° C. and 1,250° C. These treatment conditions are particularly effective for the manufacture of a substrate or of a component. The healing heat treatment, which makes it possible in the end to completely or partially recover the expected radiofrequency performance of the element, does not consist in choosing weakened rapid heat treatment conditions which would be targeted at limiting their impact on the RF characteristic of the substrate.

The semiconductor element can be a substrate, for example, a silicon-on-insulator (SOI) substrate, comprising a charge-trapping layer as was discussed previously with reference to FIG. 1, or a semiconductor device manufactured on such a substrate. This is because, particularly advantageously, the healing heat treatment according to the present disclosure is particularly versatile and can be applied either during the manufacture of a substrate or during the manufacture of a component on such a substrate.

Preferably, the healing heat treatment is carried out in situ in the rapid heat treatment device. The use of an additional device is thus avoided and the process for the manufacture of the element is simplified.

Very advantageously, the healing heat treatment is carried out by controlling the rapid fall in temperature of the device at less than 40° C. per second.

The healing heat treatment according to the disclosure is of particular use when the substrate is a wafer with a diameter of at least 200 mm. This is because it is difficult, to manufacture wafers of such sizes meeting commercial specifications without employing a rapid heat treatment. This is because the known alternative means (chemical-mechanical polishing, long annealing) do not make it possible to uniformly treat the wafer over its entire surface during a short treatment time.

Preferably, the charge-trapping layer is a polysilicon layer.

BRIEF DESCRIPTION OF THE DRAWINGS

A better understanding of the disclosure will be obtained in light of the description which follows of the nonlimiting embodiments of the disclosure, with reference to the appended figures, among which.

DETAILED DESCRIPTION

Figure 2:
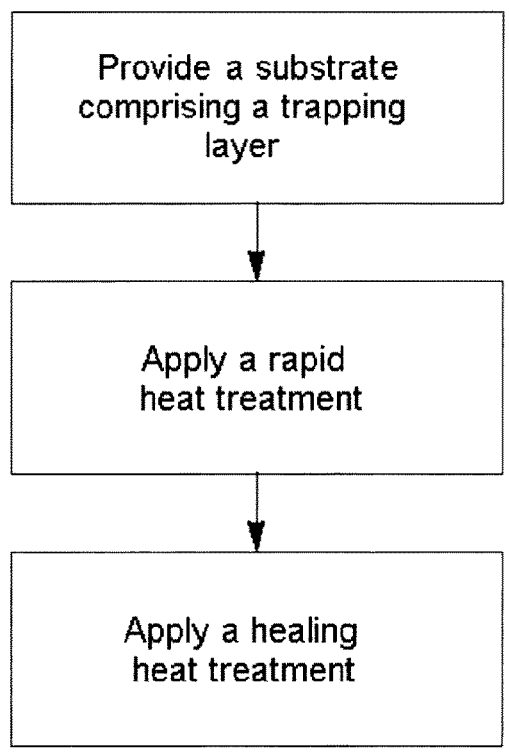
FIG. 2 represents the sequence of stages of a process for the manufacture of a semiconductor element in accordance with the present disclosure.

FIG. 2 represents the sequence of stages composing a process for the manufacture of a semiconductor element in accordance with the present disclosure.

The term "semiconductor elements" denotes without distinction a semiconductor substrate or device. In some embodiments, the semiconductor elements may be configured for applications in the RF field. The present disclosure is thus applicable to the manufacture of one or other of semiconductor substrates or devices.

During a first stage, a substrate 1 comprising a charge-trapping layer 3 is provided.

Preferably, this substrate 1 is a silicon-on-insulator (SOI) substrate exhibiting a surface silicon layer 5, an insulating layer 4, for example made of silicon oxide, and a support substrate 2. The charge-trapping layer 3 is positioned between the insulating layer 4 and the support substrate 2.

Figure 1:
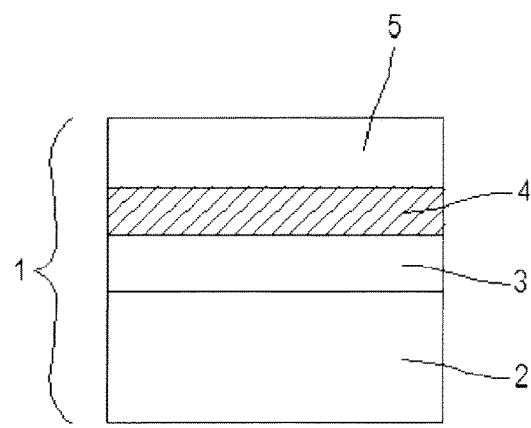
FIG. 1 represents a substrate having a charge-trapping layer.

As previously discussed with reference to FIG. 1, the substrate 1 can be prepared in multiple ways. However, preferably, the substrate 1 is manufactured by application of SMART CUT® technology, according to which a silicon oxide layer intended to form the surface silicon layer 5 and the insulating layer 4 of the substrate 1 is transferred to a support substrate 2 provided with the charge-trapping layer 3. This transfer stage is conventionally followed by a sequence of finishing the substrate 1 in order to confer the required properties on the substrate 1, and particularly, the properties of the exposed free surface of the substrate 1.

In the context of the present disclosure, the support substrate 2 preferably exhibits characteristics of high resistivity, of greater than 1 kohm·cm. It can correspond to a silicon substrate of p type exhibiting a low amount of interstitial oxygen (denoted by the expression "Low Oi") of between 6 and 10 ppm.

It can also be a silicon substrate exhibiting a high amount of interstitial oxygen (denoted by the expression "High Oi") of greater than 26 ppm.

Under certain circumstances, in particular when the charge-trapping layer 3 exhibits a thickness which is sufficient and greater than 30 microns, the support substrate 2 can exhibit a standard resistivity of, for example, less than 1 kohm.cm.

Conventionally, the substrate 1 can be provided in the form of a circular wafer, the diameter of which can be 200, 300 or indeed even 450 mm.

The charge-trapping layer 3 can be of highly varied nature, as is known in the art. Generally, it is a noncrystalline layer exhibiting structural defects, such as dislocations, grain boundaries, amorphous regions, interstices, inclusions, pores, and the like.

These structural defects form traps for the charges liable to move through the material, for example at incomplete or pendant chemical bonds. Conduction in the charge-trapping layer 3 is thus prevented, which layer consequently exhibits a high resistivity.

Advantageously, and for reasons of simplicity of use, this charge-trapping layer 3 is formed of a polycrystalline silicon layer. Its thickness, in particular when it is formed on a resistive support, can be between 1 μm and 3 μm. However, other thicknesses of less than or greater than this interval are also contemplated.

The charge-trapping layer 3 made of polycrystalline silicon can be formed by deposition on the support substrate 2 from a gaseous silicon source, such as dichlorosilane or trichlorosilane, as known in the art. In order to maintain the polycrystalline quality of this layer during the heat treatments to which the substrate 1 may be subjected, an amorphous layer, made of silicon dioxide, for example, can advantageously be provided on the support substrate 2 before the deposition of the charge-trapping layer 3.

In a following stage of a process in accordance with the disclosure, and always in connection with FIG. 2, a rapid heat treatment is applied to the substrate 1.

This rapid heat treatment stage can form part of the finishing sequence of the substrate 1 during its manufacture. It can also correspond to a stage of manufacture of a semiconductor device on the substrate 1, for example a stage of activation of dopants.

The term "rapid heat treatment" denotes a stage during which the substrate 1 is exposed to a treatment atmosphere for a maximum duration of two minutes at a plateau treatment temperature. The plateau treatment temperature is typically between 1,125 and 1,250 degrees. The phases of rise and fall in the plateau temperature are carried out at a high heat gradient of more than 60° C./s, which makes it possible to limit the total duration of the treatment.

The duration of the treatment plateau, according to the rapid heat treatment device chosen, can be very short, of the order of a few microseconds in a flash annealing device, or can extend to a duration of 15 to 45 seconds in a rapid annealing oven.

The treatment atmosphere depends on the purpose of this treatment. It can, for example, be a neutral, reducing or oxidizing atmosphere.

Figure 3:
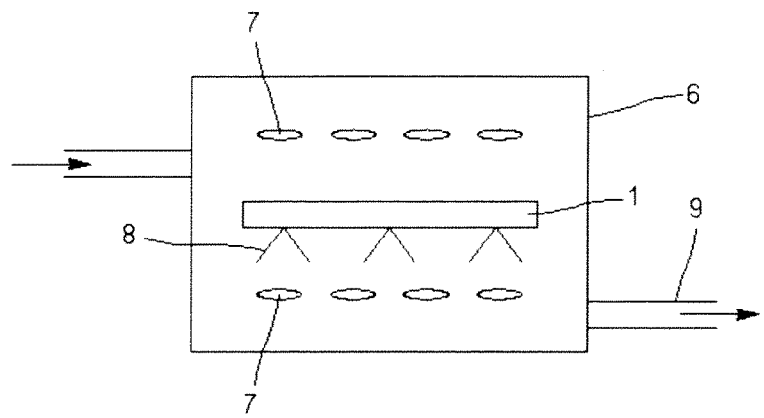
FIG. 3 represents a configuration of a rapid thermal annealing system.

In order to apply this rapid heat treatment, there is known, for example, and as is represented diagrammatically in FIG. 3, a rapid thermal annealing system comprising a quartz chamber 6 for receiving a substrate 1 to be treated. The treatment is carried out using heating lamps 7 positioned below and above the substrate 1. During the treatment, the substrate 1 is maintained in a horizontal orientation in the chamber on a support formed of three points 8. The atmosphere of the chamber can be controlled by introducing therein a chosen gas, which can be discharged via an exhaust system 9, the opening of which is controllable.

The rapid heat treatment is applied using this device by providing electric power to the lamps 7 in order to heat the substrate by radiation up to a predetermined temperature, for example, between 1,150° C. and 1,250° C. The rise in temperature of the substrate is very rapid, and may be on the order of 60° C. per second or more, with the result that from 10 to 20 seconds are necessary to reach the plateau temperature. The heat treatment is carried out at this plateau temperature for a period of time which can reach, in this system, from 30 seconds to two minutes. At the end of this period, the electric power provided to the lamps 7 is interrupted and the temperature of the substrate falls very rapidly, also at a rate on the order of 60° C. per second. Generally from 20 to 30 seconds are necessary to carry out the cooling of the substrate and to allow it to be removed from the quartz chamber. A typical temperature profile obtained in this system is, for example, reproduced in FIG. 4. It should be noted that the pyrometer that equips the chamber 6, and which makes possible temperature measurement, is active only for temperature values of greater than approximately 600° C. to 700° C., which explains the truncated shape of the plotting of FIG. 4.

On conclusion of this rapid heat treatment, it was observed, entirely surprisingly, that certain RF characteristics of the substrate 1 had deteriorated. This is in particular the case with the second harmonic distortion measurement, mention of which was discussed previously herein.

Without committing the present disclosure to any one physical interpretation of these results and of the phenomena, which might be involved, it appears that the charge-trapping layer 3 is particularly sensitive to the rapid heat treatment. The structural defects or the electrochemical bonds appear to reorganize under the effect of the temperature and/or of the temperature gradients. Additionally, the specific profile of the rapid heat treatment may favor the generation of excessive charge carriers saturating the trapping properties of the charge-trapping layer 3.

Whatever the origin thereof, the observation of a worsened radio frequency characteristic of the substrate 1 does not make it possible to guarantee the operation of a semiconductor device within the specifications required on the substrate 1.

Referring again to FIG. 2, the present disclosure provides for the rapid heat treatment stage to be followed by a healing heat treatment of the substrate 1 in order to at least partially recover the measured losses in performances.

Particularly surprisingly, a healing heat treatment of between 700° C. and 1,100° C. for a period of time of 15 seconds at least appears sufficient for the substrate 1 to exhibit an improved radio frequency characteristic. The healing heat treatment atmosphere can consist of a neutral gas, such as argon, of a reducing gas, such as hydrogen, or even of a mixture of these two gas types. It can, for example, be hydrogen-comprising nitrogen approximately 95 percent composed of nitrogen and 5 percent composed of hydrogen, which is often referred to in the art as "forming gas."

The treatment can be carried out in a conventional vertical oven. In this case, a treatment at approximately 950° C. for approximately one hour under argon or under nitrogen is then applied. This treatment can be preceded by or can comprise a phase of oxidation in order to protect the surface of the substrate 1 from the annealing environment. The oxide layer formed can then be removed on conclusion of the healing heat treatment stage by a simple chemical etching.

Particularly advantageously, the healing heat treatment is carried out in situ in the rapid heat treatment device.

Figure 5:
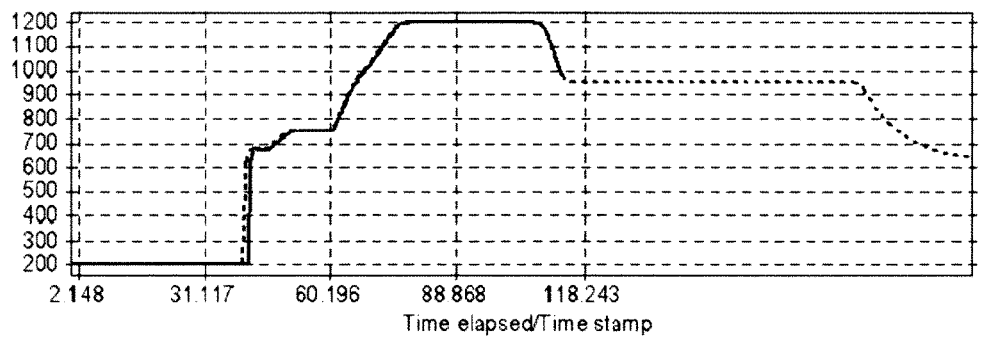
FIG. 5 represents an example of healing heat treatment according to an embodiment of the present disclosure.

By controlling the electrical energy provided to the lamps 7 of the chamber 6 of the rapid thermal annealing system on conclusion of the temperature plateau, it is possible, as is represented in FIG. 5, to follow this plateau with an annealing at 950° C. for a period of time of, for example, between 15 seconds and two minutes.

Alternatively, or in supplementing this annealing at 950° C., the healing heat treatment can be established by controlling the fall in temperature, on completion of the rapid heat treatment plateau, according to a heat gradient of 40° C. per second or slower.

This cooling, slowed down in comparison with the rapid heat treatment of the prior art, can also be obtained simply by adjusting the electric power supplies to the lamps 7 during this cooling phase.

Whatever the embodiment of the healing heat treatment chosen, it is observed that the RF characteristic of the substrate 1 is improved, in particular of that of second harmonic distortion, as is made apparent in the example which follows.

Two types of substrates A and B exhibiting a charge-trapping layer 3 were prepared. The two types A and B of substrates with a diameter of 300 mm consists of a surface silicon layer 5 with a thickness of 75 nm and of a silicon oxide insulating layer 4 with a thickness of 200 nm. The charge-trapping layer 3 consists of a layer of polycrystalline silicon with a thickness of 1.7 μm. The substrate A comprises a support substrate 2 exhibiting a resistivity of 17 kohm·cm and the substrate B of 5 kohm·cm.

These substrates A and B are structurally designed in order to provide a second harmonic distortion value of −100 dBm for the substrate A and of −90 dBm for the substrate B. These values are obtained for similar substrates which have not received a rapid heat treatment.

Figure 4:
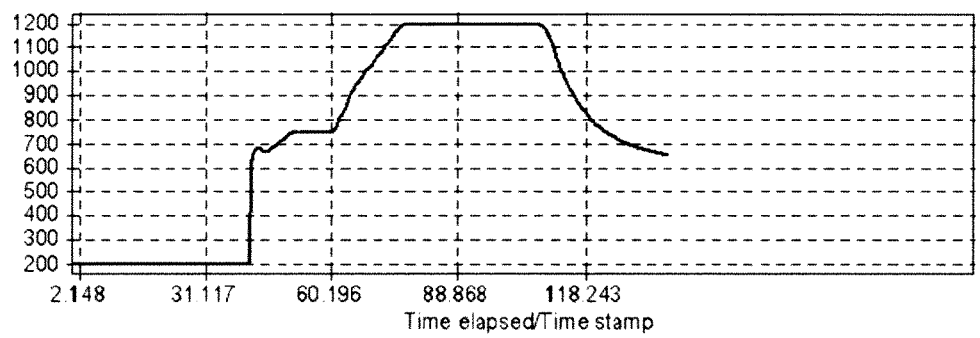
FIG. 4 reproduces the temperature profile of a rapid heat treatment in a rapid thermal annealing system.

The following treatments are applied to each of these two types of substrates A and B and the second harmonic distortion (HD2) is measured for each of them:

RTA alone: rapid heat treatment, the profile of which is given in FIG. 4;

RTA+TTH: heat treatment at 950° C. for one hour under argon after protective oxidation, after a rapid heat treatment identical to the preceding RTA treatment.

RTA+: rapid heat treatment, the profile of which is given in FIG. 5, comprising, subsequent to the plateau at 1,200° C., a healing treatment at 950° C.

|  | HD2 expected | HD2 after RTA alone | HD2 after RTA + TTH | HD2 after RTA+ |
|---|---|---|---|---|
| Substrate A | −100 dBm | −70 dBm | −101 dBm | −107 dBm |
| Substrate B | −90 dBm | −70 dBm | −92 dBm | −97 dBm |

It is thus apparent in the preceding table that the rapid heat treatment affects the measured performance of the substrate 1 and that this performance is at least partially recovered after the application of a healing heat treatment in accordance with the invention.

The invention claimed is:

1. A method of manufacturing a semiconductor element, the method comprising:
   providing a substrate comprising a support, a charge trapping layer on the support, an insulating layer on the charge trapping layer and a superficial semiconductor layer on the insulating layer;
   applying a rapid heat treatment of the substrate comprising the charge-trapping layer, the rapid heat treatment damaging an RF characteristic of the substrate; and
   following the rapid heat treatment, applying a healing heat treatment of the substrate between 700° C. and 1,100° C. for a period of time of at least 15 seconds to improve the damaged RF characteristic of the substrate.

2. The method of claim 1, wherein the healing heat treatment is carried out in a neutral or reducing atmosphere.

3. The method of claim 2, wherein the healing heat treatment comprises an annealing at 950° C. for one hour.

4. The method of claim 2, wherein the healing heat treatment comprises an annealing at 950° C. for one hour.

5. The method of claim 4, wherein the rapid heat treatment stage is carried out in a rapid heat treatment system.

6. The method of claim 5, wherein the healing heat treatment is carried out in situ in the rapid heat treatment system.

7. The method of claim 6, wherein the healing heat treatment comprises an annealing at 950° C. for a period of time of between 15 seconds and 2 minutes.

8. The method of claim 6, wherein the healing heat treatment is carried out by controlling a fall in temperature on completion of the rapid heat treatment at 40° C./s or less.

9. The method of claim 4, wherein the rapid heat treatment stage is carried out in a rapid heat treatment system.

10. The method of claim 1, wherein the rapid heat treatment comprises exposing the substrate to a treatment atmosphere for a maximum period of time of 2 minutes at a plateau temperature of between 1,125° C. and 1,250° C.

11. The method of claim 1, wherein the semiconductor element comprises an RF device.

12. The method of claim 1, wherein the semiconductor element comprises a silicon-on-insulator wafer having a diameter of at least 200 mm.

13. The method of claim 1, wherein the charge-trapping layer comprises a polycrystalline silicon layer.

14. The method of claim 1, wherein the RF characteristic of the substrate is evaluated by a second harmonic distortion measurement.

* * * * *